(12) United States Patent
Wu

(10) Patent No.: US 7,211,457 B2
(45) Date of Patent: May 1, 2007

(54) TRANSFLECTIVE LCD (LIQUID CRYSTAL DISPLAY) PANEL AND METHOD OF CONSTRUCTING THE SAME

(75) Inventor: Yang-En Wu, Taipei (TW)

(73) Assignee: AU Optronics Corp., Hsinchu (TW)

( * ) Notice: Subject to any disclaimer, the term of this patent is extended or adjusted under 35 U.S.C. 154(b) by 113 days.

(21) Appl. No.: 11/168,657

(22) Filed: Jun. 29, 2005

(65) Prior Publication Data

US 2006/0040419 A1 Feb. 23, 2006

Related U.S. Application Data

(62) Division of application No. 10/920,260, filed on Aug. 18, 2004, now Pat. No. 6,965,127.

(30) Foreign Application Priority Data

Feb. 6, 2004 (TW) .............................. 93102789 A

(51) Int. Cl.
*H01L 21/66* (2006.01)
*H01L 33/00* (2006.01)

(52) U.S. Cl. .......................................... 438/30; 257/98
(58) Field of Classification Search ................. 349/74, 349/95, 113–119; 257/79–98, 436, 451; 438/29–32, 65–67
See application file for complete search history.

*Primary Examiner*—Calvin Lee
(74) *Attorney, Agent, or Firm*—Troxell Law Office, PLLC

(57) ABSTRACT

A transflective LCD panel includes a first substrate and a second electrode layer sandwiching a liquid crystal layer therebetween. Two first electrode layer are fabricated on the first substrate facing the second electrode layer. A metal layer fabricated on the first substrate is disposed between two of the first electrode layers. A spacer layer is fabricated on the second electrode layer in alignment with the metal electrode layer. Upon application of an operating voltage onto the liquid crystal layer, an electric field induced between the metal electrode layer and the space layer is smaller than that induced between the first and second electrode layers.

4 Claims, 4 Drawing Sheets

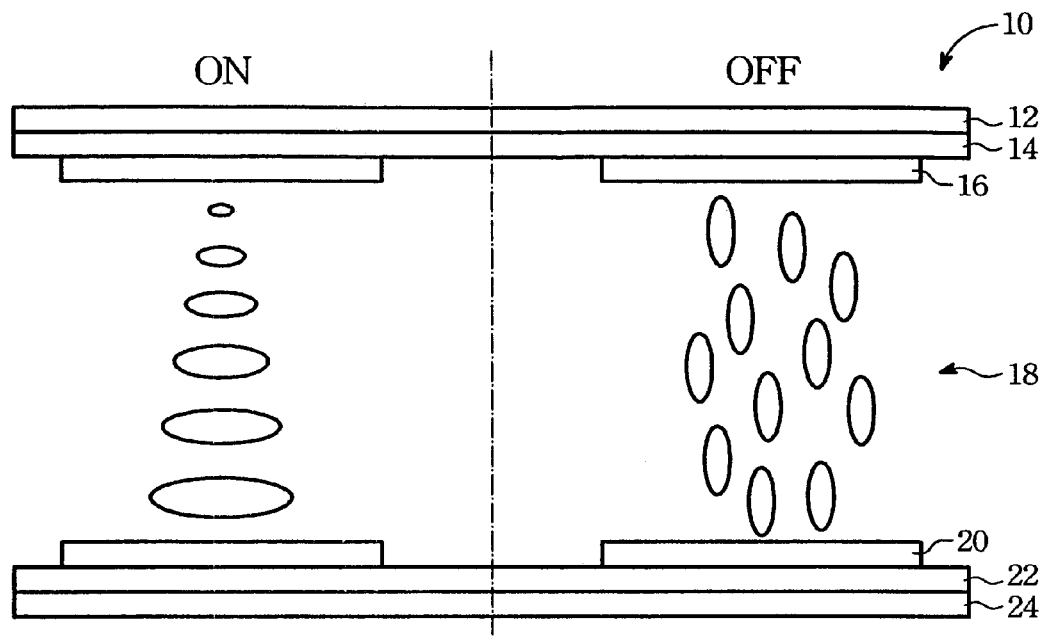
Fig. 1A (Prior Art)
Fig. 1B (Prior Art)
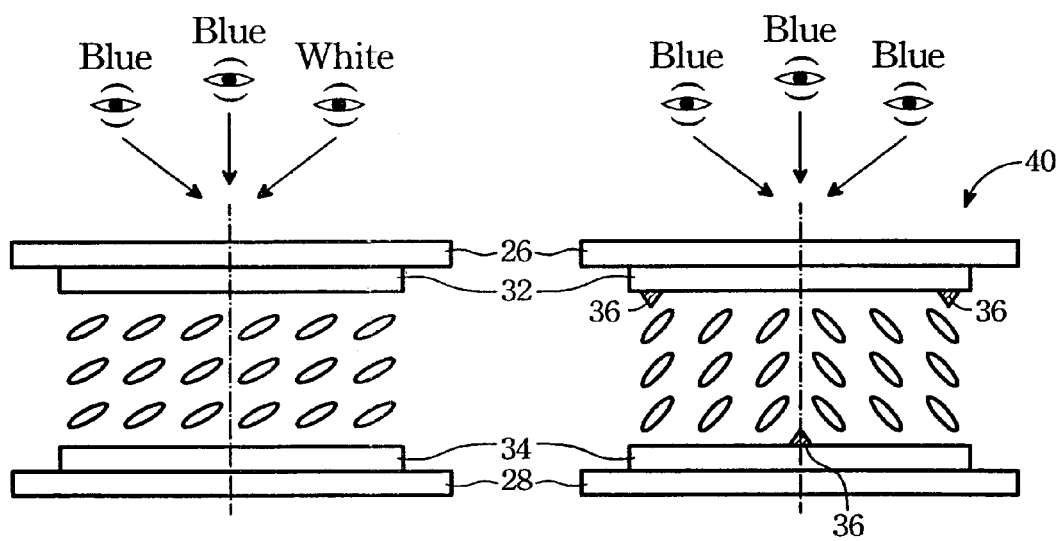
Fig. 2A (Prior Art)
Fig. 2B (Prior Art)

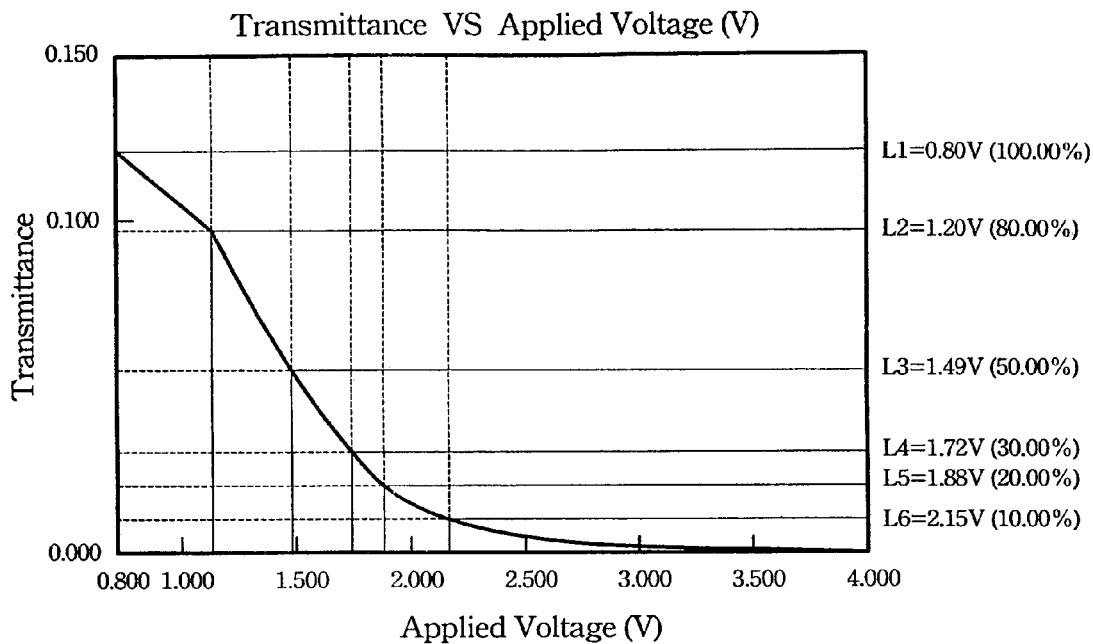
Fig. 5 A (Transmission domain)
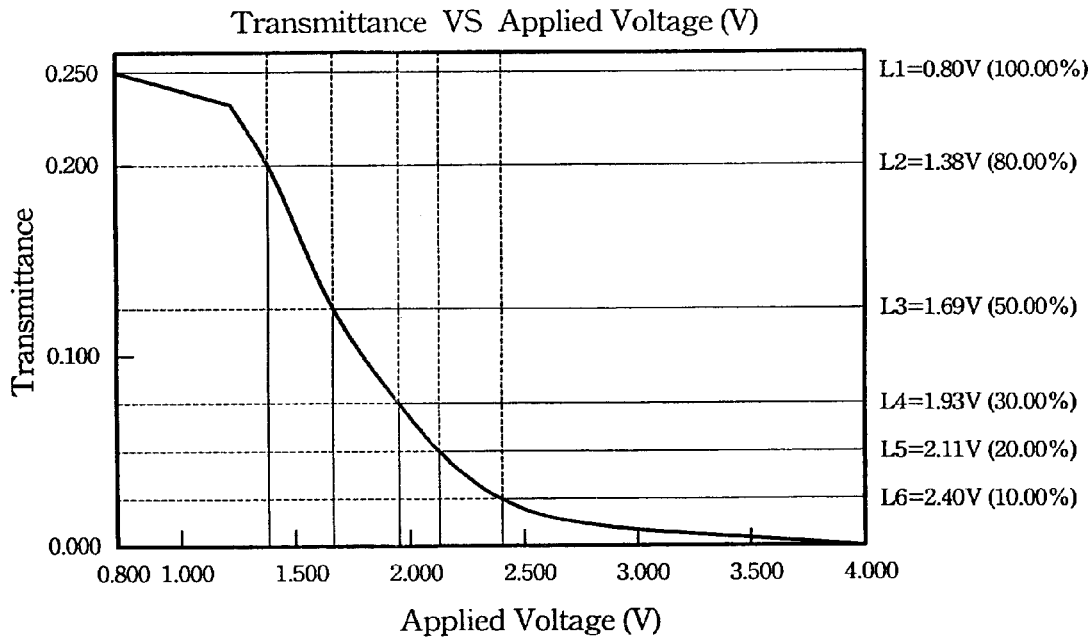
Fig. 5 B (Reflective domain)

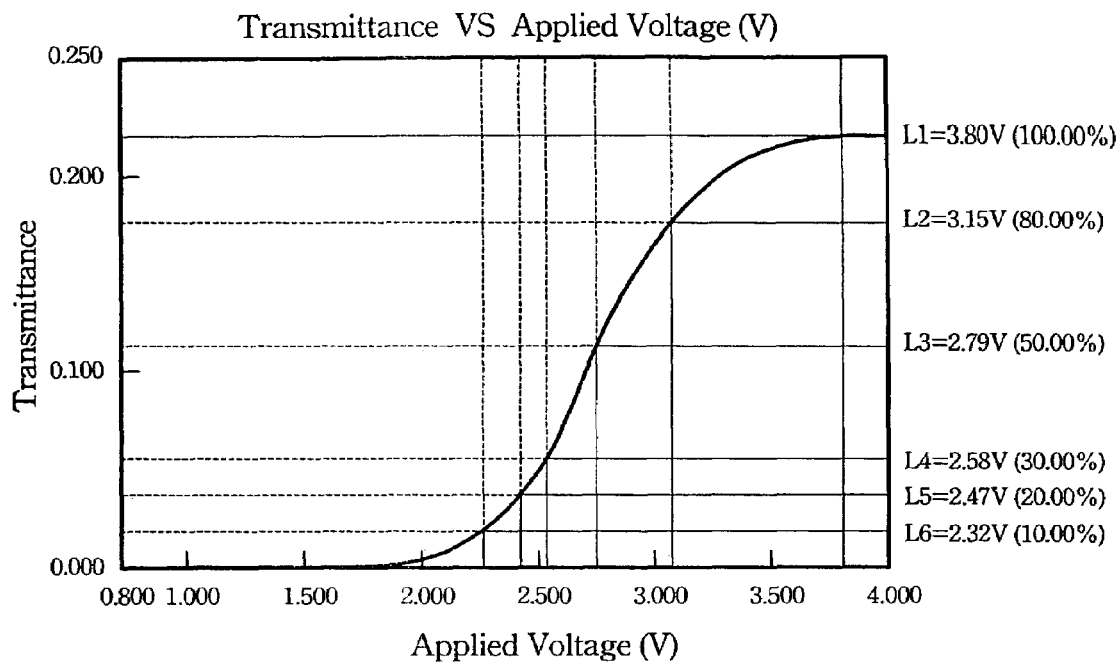
Fig. 6A (Transmission domain)
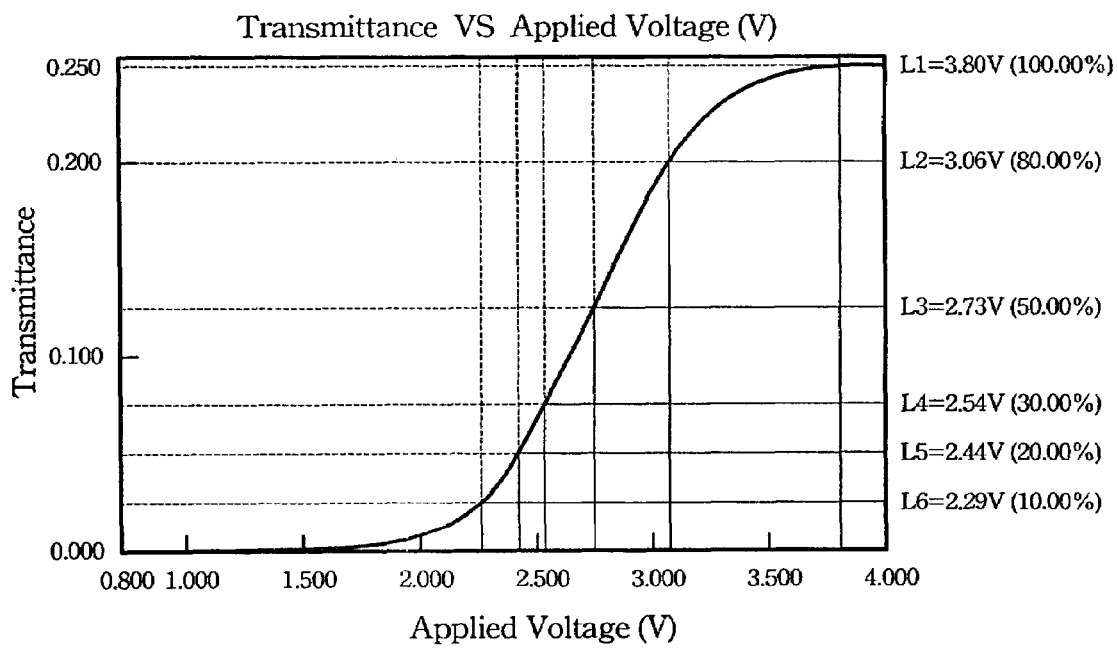
Fig. 6B (Reflective domain)

TRANSFLECTIVE LCD (LIQUID CRYSTAL DISPLAY) PANEL AND METHOD OF CONSTRUCTING THE SAME

RELATED APPLICATIONS

This application is a Division of currently application U.S. Ser. No. 10/920,260 and issued as U.S. Pat. No. 6,965,727 entitled "TRANSFLECTIVE LCD (LIQUID CRYSTAL DISPLAY) PANEL AND METHOD OF CONSTRUCTING THE SAME" and filed on Aug. 18, 2004.

FIELD OF THE INVENTION

The present invention relates to an LCD (Liquid Crystal Display) panel, more specifically to a transflective LCD panel of Vertical Alignment mode which is constructed in such a manner to provide uniform brightness throughout the entire length of the LCD panel.

BACKGROUND OF THE INVENTION

Referring to FIG. 1A, a conventional transflective LCD panel 10 of MTN (Mixed Twisted Nematic) mode is shown to include an upper polarizer 12, an upper glass substrate 14, an upper electrode 16, a liquid crystal layer 18, a lower electrode 20, a lower glass substrate 22 and a lower polarizer 24. When the transistor in the LCD panel 10 is switched on (i.e. when a voltage is applied onto opposite ends 16, 20 of the liquid crystal layer 18), an electric field will be induced, and extends parallelly to the upper and lower electrodes 16, 20. Since the phase difference between the upper and lower polarizers 12, 24 is 90°, the light beams passing through the lower polarizer 24 will be reflected from an upper surface without changing their direction so as to be perpendicular to the upper polarizer 12. Under this condition, the orientation of the liquid crystal molecules in the liquid crystal layer 18 changes from the state shown in FIG. 1B into that shown in FIG. 1A, and extends parallel to the electric field. Since the light beams cannot pass through the upper polarizer 12, black spots can be seen on the display screen.

When the transistor of the conventional LCD panel 10 is switched off (i.e. when no voltage is applied onto opposite ends 16, 20 of the liquid crystal layer 18), as shown in FIG. 1B, the orientation of the liquid crystal molecules in the liquid crystal layer 18 maintains in their initial alignment such that the light beams passing through the lower polarizer 24 will pass through the liquid crystal layer 18 and the upper polarizer 12. Thus, white spots will be formed on the display screen.

One drawback of the aforesaid conventional t transflective LCD panel 10 resides in that not all the liquid crystal molecules in the liquid crystal layer 18 extend parallelly to the electric field when voltage is applied thereon, thereby lowing the contrast ratio and consequently forming uneven distribution of brightness throughout the entire length thereof. In addition, it takes longer response time to perform the transition from their initial alignment to the displayable alignment.

In order to solve the above-stated drawbacks, in 1996 Fujitsu had proposed a Vertical Alignment system, in which an alignment member or film can be fabricated on the upper and lower electrodes to assist to change the orientation of the liquid crystal molecules in the liquid crystal layer with respect to the upper polarizer without voltage applied thereon. The light beams therefore cannot penetrate through the upper polarizer. When a voltage is applied onto the liquid crystal layer, the liquid crystal molecules make a 90° turn, thereby permitting the light beams to pass through the upper and lower polarizers. The VA system thus shortens the response time, causes an increment to the contrast ratio and helps to eliminate the drawbacks of MTN system. However, the transflective LCD panel of Vertical Alignment mode suffers from a viewable problem. For example, the user sees blue color when he is right in front of the display screen (see FIG. 2A), which means that when half voltage is applied onto the liquid crystal layer, the liquid crystal molecules turn only half way from their initial position. If he moves further right about 10 cm, he is generally aligned with the orientation of the liquid crystal molecules so that he will see white color, not the blue color.

Referring to FIG. 2B, in order to solve the viewable problem encountered during use of the conventional transflective LCD panel of VA mode, the transflective LCD panel 40 of MVA (Multi-domain Vertical Alignment) mode is proposed, and includes upper and lower glass substrates 26,28, and upper and lower electrodes 32,34. A plurality of projections 36 are fabricated on the upper and lower electrodes 32,34 so as to divide each of the pixel units into multi-domains. Under this condition, the liquid crystal molecules forming the patterns will be symmetrically disposed along the front-to-rear line such that the user standing right in front of the display screen will see the same color regardless of his viewing angle with respect to the display screen.

The LCDs can be constructed in a relatively compact size and are used in mobile phones and PDA (personal digital assistant) due to the rapid advance of TFT (Thin Film Transistor) or LTPS (Low Temperature Poly-Silicon) technique in addition to its lower power consumption and low radiation. Note that the LCDs itself are not light emitting instruments, and each requires a backlight module in order to display images and information on the display screen. When the LCD is used outdoor, the ambient light is so strong that the reflection of sunlight from the surface of the display screen overwhelms any light coming through the LCD panel. Most of today's LCDs are constructed to be tranflective in order that the display screen can be illuminated by combination of the backlight and the ambient light.

SUMMARY OF THE INVENTION

The object of the present invention is to provide a transflective LCD panel having a transmission domain and a reflective domain constructed in such a manner to provide uniform brightness throughout the entire length thereof when a voltage is passed through the LCD panel.

In one aspect, a transflective LCD (liquid crystal display) panel according to the present invention includes: a first substrate; a second substrate; a plurality of transparent first electrode layers fabricated on the first substrate and facing the second substrate; at least one metal electrode layer fabricated on the first substrate and disposed between adjacent two of the first electrode layers; at least one transparent second electrode layer fabricated on the second substrate; at least one spacer layer fabricated on the second electrode layer in alignment with the metal electrode layer; and a liquid crystal layer sandwiched between the first and second electrode layers. The first and second electrode layers cooperatively define a transmission domain therebetween. The metal electrode layer and the spacer layer cooperatively define a reflective domain therebetween that is shorter than the transmission domain along a vertical line.

In another aspect, a method for constructing a transflective LCD panel according to the present invention includes the steps: (a) forming first and second substrates; (b) fabricating a plurality of transparent first electrode layers on the first substrate in such a manner that each of the first electrode layers faces the second substrate; (c) fabricating at least one metal electrode layer on the first substrate so as to dispose the metal electrode layer between adjacent two of the first electrode layers; (d) forming a transparent second electrode layer on the second substrate to face the first substrate; (e) fabricating at least one spacer layer on the second electrode layer in alignment with the metal electrode layer; and sandwiching a liquid crystal layer between the first and second electrode layers in such a manner that the first and second electrode layers cooperatively defines a transmission domain therebetween and that the metal electrode layer and the spacer layer cooperatively defines a reflective domain therebetween which is shorter than the transmission domain distance along a vertical line.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 1A and 1B respectively show how liquid crystal molecules in the liquid crystal layer of a conventional transflective LCD panel of MTN (Mixed Twisted Nematic) mode behave when voltage is applied thereon or not;

FIGS. 2A and 2B show a comparison of viewable angles between a conventional LCD panel of VA (Vertical Alignment) mode and MVA (multi-domain Vertical Alignment) mode;

FIG. 5A is a graph showing relation between the transmittance rate and the applied voltage of a transmission domain in the liquid crystal unit of the conventional transflective LCD panel of MTN mode;

FIG. 5B is a graph showing relation between the transmittance rate and the applied voltage of a reflective domain in the liquid crystal unit of the conventional transflective LCD panel of MTN mode;

FIG. 6A is a graph showing relation between the transmittance rate and the applied voltage of a transmission domain in the liquid crystal unit of the transflective LCD panel of MVA mode according to the present invention;

FIG. 6B is a graph showing relation between the transmittance rate and the applied voltage of a reflective domain in the liquid crystal unit of the transflective LCD panel of MVA mode according to the present invention;

Table 1 shows the conditions for light beams passing through the liquid crystal unit shown in FIGS. 5A and 5B;

Table 2 shows the transmission level and the applied voltage for light beams passing through the transmission and reflective domains in the liquid crystal unit shown in FIGS. 5A and 5B;

Table 3 shows the conditions for light beams passing through the liquid crystal unit shown in FIGS. 6A and 6B according to the present invention; and Table 4 shows the transmission level and the applied voltage for light beams passing through the transmission and reflective domains in the liquid crystal unit shown in FIGS. 6A and 6B according to the present invention.

DETAILED DESCRIPTION OF THE PREFERRED EMBODIMENT

Figure 3:
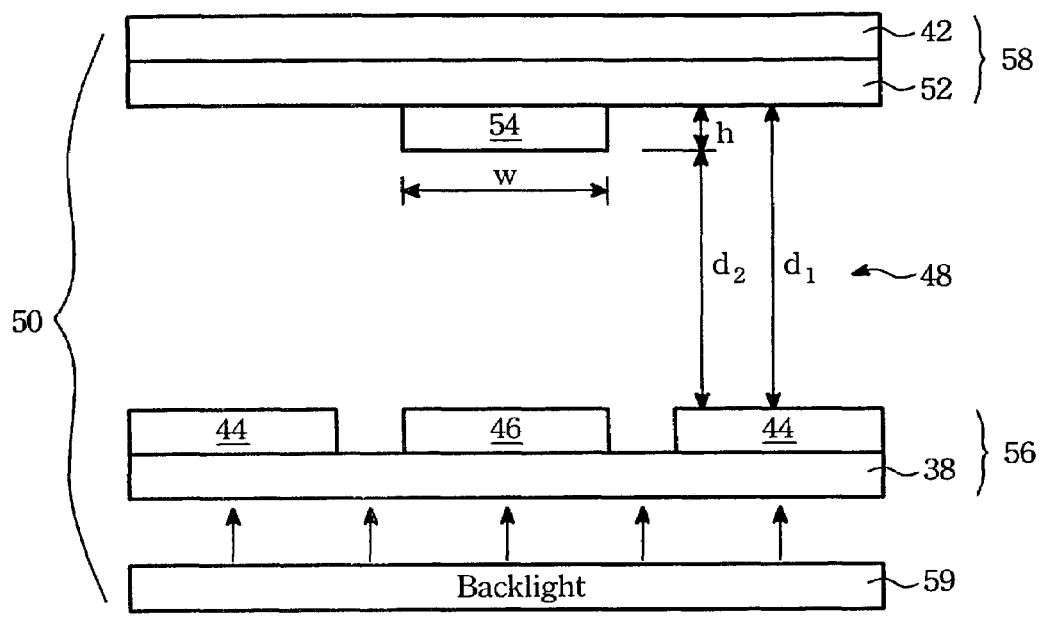
FIG. 3 shows a liquid crystal unit employed in the transflective LCD panel of the present invention.

Referring to FIG. 3, a liquid crystal unit 50 of a transflective LCD panel according to the present invention is shown to include a first substrate 38, a second substrate 42, a plurality of transparent first electrode layers 44, at least one metal electrode layer 46, a liquid crystal layer 48, a transparent second electrode layer 52 and a spacer layer 54. The liquid crystal unit 50 of the transflective LCD panel is divided into a first panel part 56 consisting of the first substrate 38, the first electrode layers 44 and the metal electrode layer 46, and a second panel part 58 consisting of the second electrode layer 52 and the second substrate 42. The liquid crystal layer 48 is sandwiched between the first and second panel parts 56,58.

As illustrated, the first and second substrates 38,42 are made from transparent glass material, serving as base substrates respectively. In fact, the present transflective LCD panel is an active matrix LCD panel so that the first substrate 38 includes a TFT array that faces the second substrate 42 and that is formed by a plurality of thin-film transistors. Each of the transistors is connected to a pixel electrode in order to control the switch on or switch off of a respective transistor. Color filters can be disposed on the second substrates 42 in such a manner to face the first substrate 38.

The first electrode layers 44 are fabricated on the first substrate 38, facing the second substrate 42. Each of the first electrode layers 44 being the pixel electrode, is rod-shaped, and is made from a conductive glass material, such as Indium-Tin Oxide, which provides effective light transmission rate. Other transparent conductive glass material can also be used to form the pixel electrode.

The metal electrode layer 46 is fabricated on the first substrate 38 between adjacent two of the first electrode layers 44. Aluminum (Al), chromium (Cr), brass (Cu) having good electrical conductivity are some of the materials for forming the metal electrode layer 46 such that the ambient light beams getting into the display panel can be reflected back therefrom.

The second electrode layer 52 fabricated on the second substrate 42 is a common electrode, is made from Indium-Tin Oxide. Similar to the first electrode layer 44, other transparent conductive glass material can also be used to form the second electrode layer 52. In FIG. 3, each of the first electrode layers 44 cooperates with the second electrode layer 52 to define "a transmission domain d1" therebetween. In addition, the first substrate 38 may include some brightness enhancing members, such as a quarter wavelength plate and polarizers. Since the relevant feature of the present invention does not reside therein, a detailed description thereof is omitted herein for the sake of brevity.

The spacer layer 54 is fabricated on the second electrode layer 52 in alignment with the metal electrode layer 46, and cooperating with the latter to define "a reflective domain d2" which is shorter than "the transmission domain d1" along a vertical line. The dimension and number of the spacer layer 54 should correspond to the metal electrode layer 46 in order to control the total reflectivity of the display screen, thereby lowering the electric field induced therebetween.

In order to shorten the manufacture time of the transflective LCD panel of the present invention, the first and second panel parts 56, 58 can be separately constructed as by-products, which are assembled together later to form a sealed body that defines a clearance filled by the liquid crystal layer 48. Note that, the thickness "h" of the spacer layer 54 can be arranged at 1 µm while the width "w" thereof is at 30 µm, the transmission domain d1 is arranged at 4 µm, and the distance d2 is arranged at 3 µm.

When an operating voltage is applied on opposite ends of the liquid crystal layer 48, an electric field strength is induced between the first and second electrode layers 44,52 (the electric field strength of the transmission domain d1) which is greater than that induced between the metal electrode layer 46 and the spacer layer 54 (the electric field strength of the reflective domain d2). Note that in the present transflective LCD panel, since the light beams have to pass the reflective domain d2 twice, one way in and one way out after reflection. The total reflectivity of the reflective domain d2 can be controlled by adjusting the thickness "h" of the spacer layer 54 so as to be proximate to the reflectivity of the transmission domain d1. Thus, under the same applied voltage, though the electric field strength of the transmission domain d1 and the reflective domain d2 are different, the total reflectivity in the reflective domain d2 is substantially equal to that in the transmission domain d1, thereby enhancing the sharpness and brightness in the reflective domain so as to provide uniform brightness throughout the entire length of the display screen.

Figure 4:
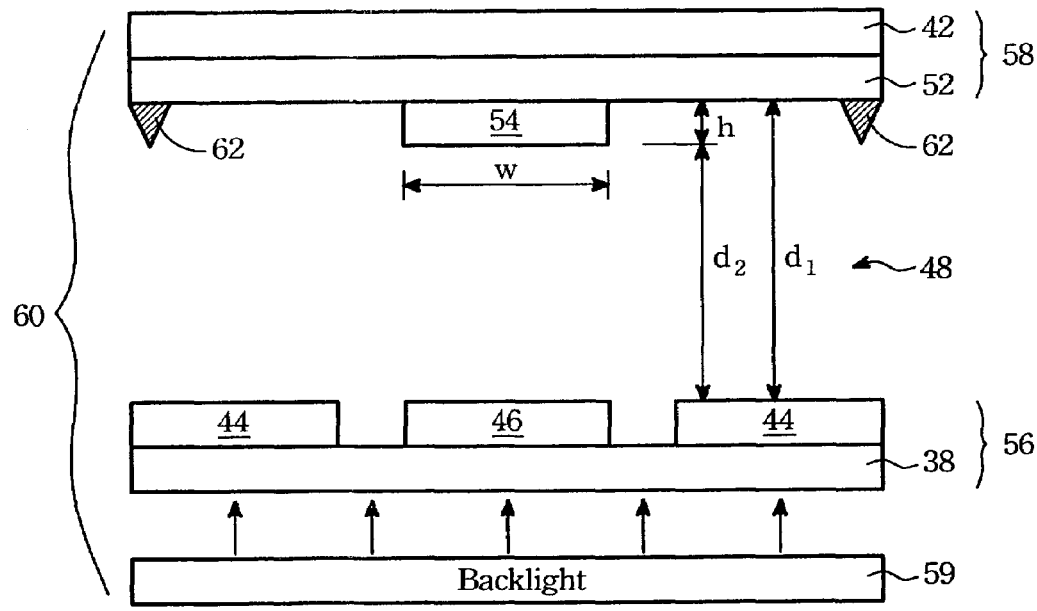
FIG. 4 shows the transflective LCD panel of MVA mode according to the present invention.

The distinct feature of the present invention can be used in the transflective LCD panel 60 of MVA mode, as best shown in FIG. 4, where two projections 62 are formed on the second electrode layer 52 in alignment with the first electrode layers 44 respectively, and are disposed at two opposite sides of the spacer layer 54. During the manufacture of the second panel part 58, the projections 62 can be fabricated on the second electrode layer 52 simultaneously with the spacer layer 54. In the same manner, the metal electrode layer 46 can be fabricated on the first substrate 38 simultaneously with the first electrode layer 44. Under such condition, the total manufacturing time of the present transflective LCD panel can be reduced. Of course, a backlight 59 is disposed adjacent to the first substrate 38 to provide light source to the display screen.

FIGS. 5A and 5B respectively show the graphs representing when light passed through the transmission domain and the reflective domain of the liquid crystal unit of the conventional transflective LCD panel of MTN mode under the conditions of tables 1 and 2, respectively. An experiment is conducted to let the light beams pass through the transmission and reflective domains d1, d2 of the LC unit (see FIG. 4) in the present transflective LCD panel as shown in FIGS. 6A and 6B under the conditions shown tables 3 and 4, respectively.

According to FIGS. 5A and 5B, the horizontal and vertical lines respectively represent the applied voltage and the relative transmittance level of the transmission and reflective domains in the LC unit of the conventional transflective LCD panel, wherein L1, L2, . . . , L6 respectively represent the transmittance level in percentage. The conventional LCD panel has the conditions shown in table 1. FIGS. 5A and 5B respectively show results of the carried out experiment, assuming that the operating voltage 0.8V(=L1) applied onto the transmission and reflective domains can result in the transmittance level of 100%. Under such condition, in order to achieve the same transmittance level (i.e. 50%, 20%, 10% etc.), different operating voltages must be applied respectively on the transmission and reflective domains (see columns 2 and 3 respectively in table 2). For example, in order to achieve 80% of the transmittance level, 1.20v(=L2) must be applied onto the transmission domain of FIG. 5A while 1.38v (=L2) must be applied onto the reflective domain of FIG. 5B. In order to achieve 50% of the transmittance level, 1.49V(=L3) must be applied onto the transmission domain of FIG. 5A while 1.69V(=L3) must be applied onto the reflective domain of FIG. 5B and so forth. Column 4 of table 2 shows the voltage difference between the two adjacent domains under the same transmittance level.

According to FIGS. 6A and 6B, the horizontal and vertical lines respectively represent the applied voltage and the transmittance level of the transmission and reflective domains in the LC unit of the present transflective LCD panel, wherein L1, L2, . . . , L6 respectively represent the transmittance level in percentage. The present transflective LCD panel has the conditions shown in table 3. FIGS. 6A and 6B respectively show results of a carried out experiment, assuming that the operating voltage 3.80V(=L1) applied onto the transmission and reflective domains can result in the transmittance level of 100%. Under such condition, in order to achieve the same transmittance level (i.e. 50%, 20%, 10% etc.), different operating voltages must be applied respectively on the transmission and reflective domains (see columns 2 and 3 respectively in table 4). For example, in order to achieve 80% of transmittance level, 315V(=L2) must be applied onto the transmission domain of FIG. 6A while 3.06V(=L2) must be applied onto the reflective domain of FIG. 6B. In order to achieve 50% of transmittance level, 2.58V(=L3) must be applied onto the transmission domain of FIG. 6A while 2.73V(=L3) must be applied onto the reflective domain of FIG. 6B and so on. Column 4 of table 4 shows the voltage difference between the two adjacent domains under the same transmittance level. From FIGS. 5A and 5B, a major difference can be noted in the curved lines representing the transmittance level and the applied voltage of the transmission and reflective domains in the LC unit of the prior transflective LCD panel. The aforesaid major difference can be confirmed by studying the figures shown in column 4 of table 2. In contrast, from FIGS. 6A and 6B, only a minor difference can be observed in the curved lines representing the transmittance level and applied voltage of the transmission and reflective domains d1, d2 in the LC unit of the transflective LCD panel of the present invention. The aforesaid minor difference can be confirmed by studying the figures shown in column 4 of table 4. In other words, by virtue of adjusting the thickness "h" of the spacer layer 54, the total reflectivity in the reflective domain d2 is substantially equal to the reflectivity in the transmission domain d1, thereby enhancing the sharpness and brightness in the reflective domain so as to provide uniform brightness throughout the entire length of the display screen.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

TABLE 1

| Mode | Elements | Product | Remark |
| --- | --- | --- | --- |
| Reflective domain | Polarizer | Nitto Polarizer | Transmission axis 0° |
| | λ/4 wave plate | Arton Film | Axis length 45° |
| | Liquid crystal layer | Merk5036 | Rubbing angle: 30–110° |
| | | | Gap: 4 μm |
| | | | Pitch: 80 μm |
| | | | Pretilt angle: 8° |
| | Reflector | Snell's Law | |
| Transmission domain | Polarizer | Nitto Polarizer | Transmission axis 0° |
| | λ/4 wave plate | Arton Film | Axis length 45° |
| | Liquid crystal layer | Merk5036 | Rubbing angle: 30–110° |
| | | | Gap: 4 μm |
| | | | Pitch: 80 μm |
| | | | Pretilt angle: 8° |
| | λ/4 wave plate | Arton Film | Axis length 135° |
| | Polarizer | Nitto Polarizer | Transmission axis 90° |

TABLE 2

| Transmittance level in percent | Voltage applied onto the reflective domain | Voltage applied onto the transmission domain | Voltage difference |
|---|---|---|---|
| 100% | 0.80 V | 0.80 V | 0 |
| 80% | 1.38 V | 1.20 V | 0.18 |
| 50% | 1.69 V | 1.49 V | 0.20 |
| 30% | 1.93 V | 1.72 V | 0.21 |
| 20% | 2.11 V | 1.88 V | 0.23 |
| 10% | 2.40 V | 2.15 V | 0.25 |

TABLE 3

| Mode | Elements | Product | Remark |
|---|---|---|---|
| Reflective domain | Polarizer | Nitto Polarizer | Transmission axis 125° |
| | λ/4 wave plate | Arton Film | Axis length 170° |
| | Liquid crystal layer | Merk6608 | Rubbing angle: 200–290° |
| | | | Gap: 3 μm |
| | | | Pitch: 80 μm |
| | | | Pretilt angle: 87° |
| Transmission domain | Reflector | Snell's Law | |
| | Polarizer | Nitto Polarizer | Transmission axis 125° |
| | λ/4 wave plate | Arton Film | Axis length 170° |
| | Liquid crystal layer | Merk6608 | Rubbing angle: 200–290° |
| | | | Gap: 5.2 μm |
| | | | Pitch: 80 μm |
| | | | Pretilt angle: 87° |
| | λ/4 wave plate | Arton Film | Axis length 80° |
| | Polarizer | Nitto Polarizer | Transmission axis 35° |

TABLE 4

| Transmittance level in percent | Voltage applied onto the reflective domain | Voltage applied onto the transmission domain | Voltage difference |
|---|---|---|---|
| 100% | 3.80 V | 3.80 V | 0 |
| 80% | 3.06 V | 3.15 V | 0.09 |
| 50% | 2.73 V | 2.79 V | 0.06 |
| 30% | 2.54 V | 2.58 V | 0.04 |
| 20% | 2.44 V | 2.47 V | 0.03 |
| 10% | 2.29 V | 2.32 V | 0.03 |

I claim:

1. A method for constructing a transflective LCD panel comprising the steps:

(a) forming first and second substrates;

(b) fabricating a plurality of transparent first electrode layers on said first substrate in such a manner that each of said first electrode layers faces toward said second substrate;

(c) fabricating at least one metal electrode layer on said first substrate so as to dispose said metal electrode layer between adjacent two of said first electrode layers;

(d) forming a transparent second electrode layer on said second substrate to face said first substrate;

(e) fabricating at least one spacer layer on said second electrode layer in alignment with said metal electrode layer; and (f) sandwiching a liquid crystal layer between said first and second electrode layers in such a manner that said first and second electrode layers cooperatively defines a transmission domain therebetween and that said metal electrode layer and said spacer layer cooperatively defines a reflective domain therebetween which is shorter than said transmission domain distance along a vertical line.

2. The method according to claim 1, further comprising a step of forming at least two projections on said second electrode layer at two opposite sides of said spacer layer.

3. The method according to claim 1, wherein upon application of an operating voltage onto the liquid crystal layer, an electric field induced between said first and second electrode layers is greater than that induced between said metal electrode layer and said spacer layer.

4. The method according to claim 3, further comprising a step of disposing a backlight adjacent to said first substrate to permit emission of light beams through said first substrate, said metal electrode layer, said first electrode layers, said liquid crystal layer, said spacer layer, said second electrode layer and said second substrate.

* * * * *